(12) United States Patent
Chen

(10) Patent No.: US 11,621,052 B1
(45) Date of Patent: Apr. 4, 2023

(54) METHOD FOR TESTING MEMORY DEVICE AND TEST SYSTEM

(71) Applicant: NANYA TECHNOLOGY CORPORATION, New Taipei (TW)

(72) Inventor: Jyun-Da Chen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/643,841

(22) Filed: Dec. 13, 2021

(51) Int. Cl.
*G11C 29/54* (2006.01)
*G11C 11/406* (2006.01)

(52) U.S. Cl.
CPC .......... *G11C 29/54* (2013.01); *G11C 11/406* (2013.01)

(58) Field of Classification Search
CPC .............................. G11C 29/54; G11C 11/406
See application file for complete search history.

(56) References Cited

U.S. PATENT DOCUMENTS

2010/0182864 A1* 7/2010 Ichimura .......... G11C 11/40622
365/236

FOREIGN PATENT DOCUMENTS

CN          113764015 A      12/2021

* cited by examiner

*Primary Examiner* — Xiaochun L Chen
(74) *Attorney, Agent, or Firm* — CKC & Partners Co., LLC

(57) ABSTRACT

A method for testing a memory device includes the following steps of: generating a first refresh command to the memory device; storing a first refresh address information into a register of the memory device according to the first refresh command; reading out the first refresh address information according to a mode register read command; comparing the first refresh address information with an expectation address information to generate a comparison result; and generating a second refresh command to the memory device or screening out the memory device according to the comparison result.

15 Claims, 2 Drawing Sheets

METHOD FOR TESTING MEMORY DEVICE AND TEST SYSTEM

BACKGROUND

Field of Invention

The present disclosure relates to an electronic system and a method. More particularly, the present disclosure relates to a test system and a method for testing a memory device.

Description of Related Art

Each of conventional memory devices is composed of a plurality of memory cells. Memory cells are composed of capacitors. Memory devices have a leakage current due to process problems. Therefore, memory devices should be accessed a refresh command to protect data stored in memory cells periodically. However, due to memory cell property and test cost, memory devices are usually configured to verify a refresh command at a low speed and a high temperature.

For the foregoing reason, there is a need to provide some other a method for testing a memory device to solve the problems of the prior art.

SUMMARY

One aspect of the present disclosure provides a method for testing a memory device. The method for testing the memory device includes the following steps of: generating a first refresh command to the memory device; storing a first refresh address information into a register of the memory device according to the first refresh command; reading out the first refresh address information according to a mode register read command; comparing the first refresh address information with an expectation address information to generate a comparison result; and generating a second refresh command to the memory device or screening out the memory device according to the comparison result.

Another aspect of the present disclosure provides a test system. The test system includes a test equipment and a memory device. The test equipment is configured to generate a first refresh command and a mode register read command. The memory device is coupled to the test equipment. The memory device includes a register and a refresh circuit. The register is configured to store a first refresh address information according to the first refresh command. The refresh circuit is coupled the register. The refresh circuit is configured to read out the first refresh address information according to the mode register read command. The test equipment is configured to compare the first refresh address information with an expectation address information to generate a comparison result. The test equipment is configured to generate a second refresh command to the memory device or screening out the memory device according to the comparison result.

These and other aspects of the present disclosure will become apparent from the following description of the preferred embodiment taken in conjunction with the following drawings, although variations and modifications therein may be effected without departing from the spirit and scope of the novel concepts of the disclosure.

It is to be understood that both the foregoing general description and the following detailed description are by examples, and are intended to provide further explanation of the present disclosure as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
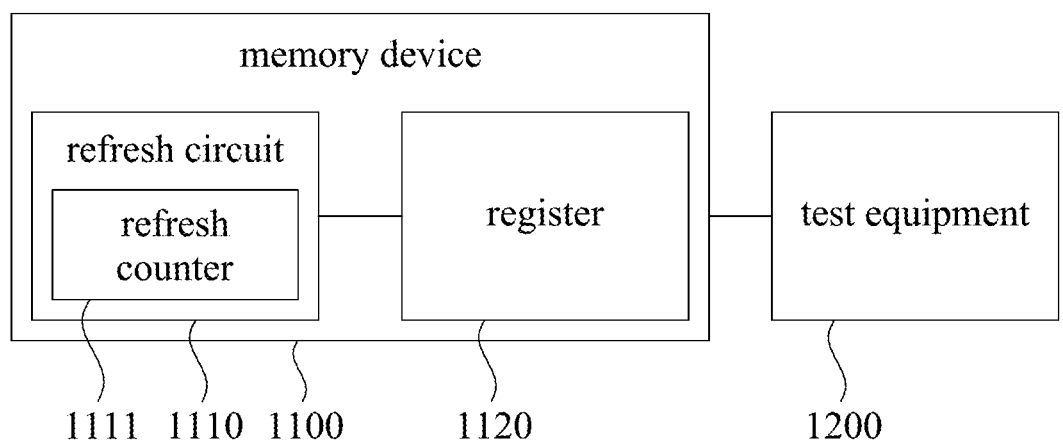
FIG. 1 depicts a schematic diagram of a test system according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 depicts a schematic diagram of a test system 1000 according to one embodiment of the present disclosure. In some embodiments, the test system 1000 includes a memory device 1100 and a test equipment 1200. The memory device 1100 is coupled to the test equipment 1200. The memory device 1100 includes a refresh circuit 1110 and a register 1120. The refresh circuit 1110 is coupled to the register 1120.

In some embodiments, the test equipment 1200 is configured to generate a first refresh command and a mode register read command. The memory device 1100 is coupled to the test equipment. The register 1120 is configured to store a first refresh address information according to the first refresh command. The refresh circuit 1110 is configured to read out the first refresh address information according to a mode register read command. The test equipment 1200 is configured to compare the first refresh address information with an expectation address information to generate a comparison result. The test equipment 1200 is configured to generate a second refresh command to the memory device 1100 or screen out the memory device 1100 according to the comparison result.

In some embodiments, the memory device 1100 includes dynamic random access memories (DRAM). In some embodiments, the memory device 1100 is composed of a plurality of memory cells. The plurality of memory cells are arranged in rows and columns.

In some embodiments, the refresh circuit 1110 is configured to refresh memory cells of one of rows of the memory device 1100 to generate a refresh address information according to a refresh command.

In some embodiments, the refresh circuit 1110 includes a refresh counter 1111. The refresh counter 1111 is configured to count a number of test loops that generate refresh commands.

Figure 2:
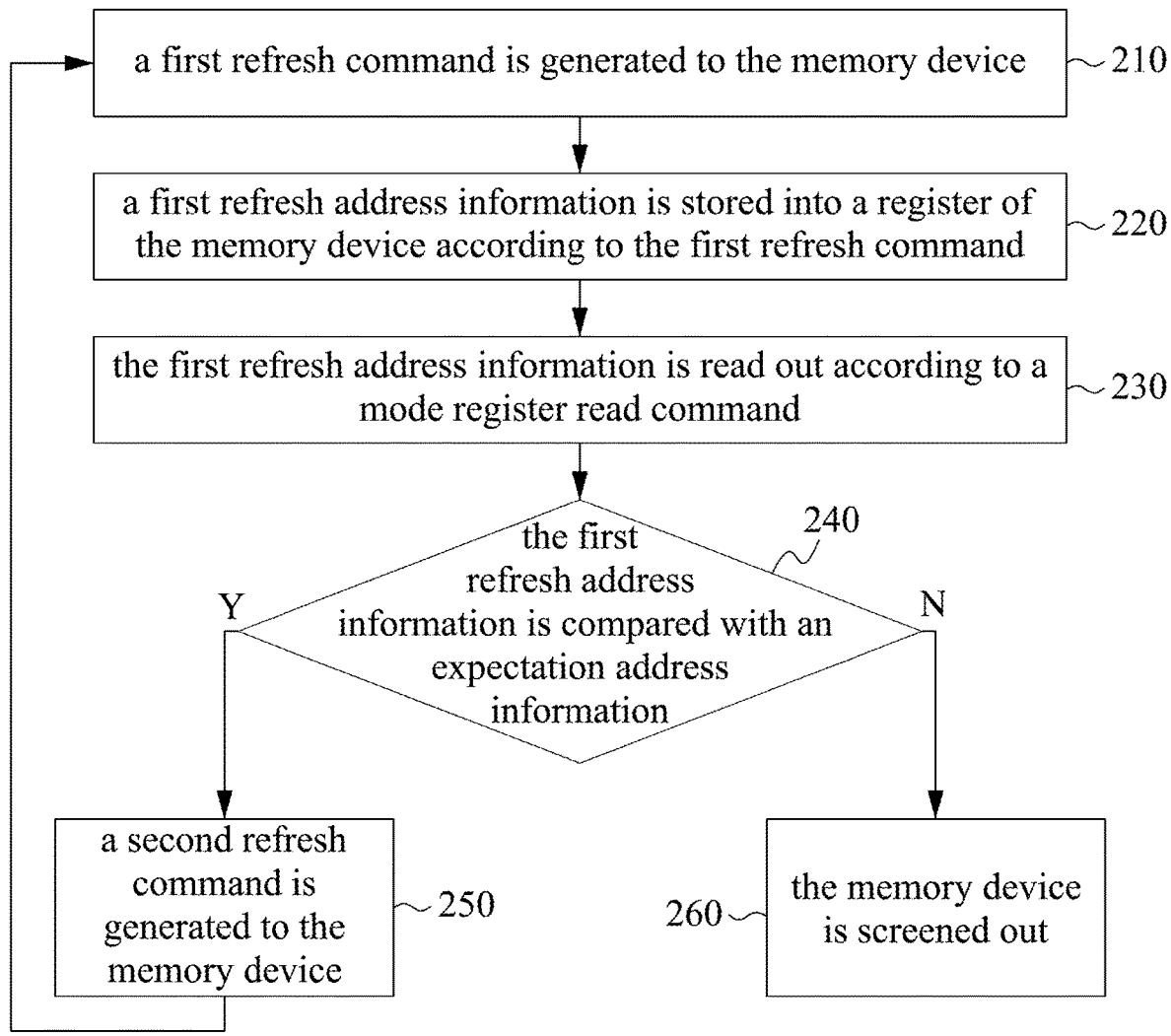
FIG. 2 depicts a flow chart of a method for testing a memory device according to one embodiment of the present disclosure.

In some embodiments, in order to facilitate the understanding of a testing system 1000 for testing the memory device 1100 shown in FIG. 1. Please refer to FIG. 1 and FIG. 2. FIG. 2 depicts a flow chart of a method 200 for testing a memory device 1100 according to one embodiment of the present disclosure. In some embodiments, the method 200 for testing a memory device includes step 210 to step 260, which will be described as shown below.

In step 210, a first refresh command is generated to the memory device. In some embodiments, please refer to FIG. 1 and FIG. 2, a first refresh command and a mode register read command are generated into the refresh circuit 1110 of the memory device 1100 by the test equipment 1200.

In step 220, a first refresh address information is stored into a register of the memory device according to the first refresh command. In some embodiments, please refer to FIG. 1 and FIG. 2, a first refresh address information is stored according to the first refresh command by the register 1120.

In some embodiments, the refresh circuit 1110 is configured to receive the first refresh command. The refresh circuit 1110 is configured to refresh memory cells of one of rows of the memory device 1100 so as to generate the first refresh address information according to the first refresh command. The refresh circuit 1110 is configured to transmit the first refresh address information into the register 1120 for storing.

It should be noted that the refresh circuit 1110 is configured to read one row at one time according to one refresh command. In other words, each of refresh commands means a different signal. To further illustrate, memory refreshing is a process of periodically reading information from an area of the memory device 1100 and immediately rewriting the read information to the same area without modification.

In step 230, the first refresh address information is read out according to a mode register read command.

In some embodiments, please refer to FIG. 1 and FIG. 2, a mode register read command is generate to the refresh circuit 1110 of the memory device 1100 by the test equipment 1200. The refresh circuit 1110 is configured to read out the first refresh address information from the register 1120 according to the mode register read command. The refresh circuit 1110 is configured to output the first refresh address information via an I/O output pad to the test equipment 1200 without passing the refresh counter 1111.

In step 240, the first refresh address information is compared with an expectation address information.

In some embodiments, please refer to FIG. 1 and FIG. 2, the first refresh address information is compared with an expectation address information to generate a comparison result by the test equipment 1200. In some embodiments, the expectation address information is stored in the test equipment 1200.

It is noted that each of rows of the memory device 1100 has different kinds of refresh address information, and the test equipment 1200 already has different kinds of expectation address information corresponding to each of rows.

For example, the memory device 1100 has 16 rows. After a process of memory refreshing, the memory device 1100 is configured to generate 16 kinds of refresh address information corresponding to each of the 16 rows. The test equipment 1200 already has 16 kinds of expectation address information corresponding to each of the 16 rows. The test equipment 1200 is configured to compare whether the 16 kinds of refresh address information are the same as the 16 kinds of expectation address information.

In some embodiments, the step 250 is executed if the comparison result is that the first refresh address information is the same as the expectation address information by the test equipment 1200.

In some embodiments, the step 260 is executed if the comparison result is that the first refresh address information is different from the expectation address information by the test equipment 1200.

In step 250, a second refresh command is generated to the memory device. In some embodiments, please refer to FIG. 1 and FIG. 2, a second refresh command is generated to the memory device 1100 according to the comparison result by the test equipment 1200. The comparison result is that the first refresh address information is the same as the expectation address information. In other words, one of rows of the memory device 1100 is normal. Therefore, the test equipment 1200 is configured to generate a different refresh command so as to test another one of rows of the memory device 1100.

In step 260, the memory device is screened out. In some embodiments, please refer to FIG. 1 and FIG. 2, the memory device 1100 is screened out according to the comparison result by the test equipment 1200. The comparison result is that the first refresh address information is different from the expectation address information. In other words, one of rows of the memory device 1100 is broken. The memory device 1100 needs to be screened out. In some embodiments, the aforementioned steps 210 to 240 can be executed repeatedly.

Based on the above embodiments, the present disclosure provides a method 200 for testing a memory device 1100 and a test system 1000 to store a refresh address information into a register 1120 at first so as to allow memory device 1100 to verity refresh commands at a high speed and a low temperature.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for testing a memory device, comprising:
generating a first refresh command to the memory device;
storing a first refresh address information into a register of the memory device according to the first refresh command;
reading out the first refresh address information according to a mode register read command;
comparing the first refresh address information with an expectation address information to generate a comparison result; and
generating a second refresh command to the memory device or screening out the memory device according to the comparison result.

2. The method for detecting the memory device of claim 1, wherein the memory device comprises a dynamic random access memory (DRAM).

3. The method for detecting the memory device of claim 1, wherein the first refresh command is different from the second refresh command.

4. The method for detecting the memory device of claim 1, wherein generating the first refresh command to the memory device comprises:
refreshing memory cells of one of rows of the memory device to generate the first refresh address information according to the first refresh command.

5. The method for detecting the memory device of claim 1, wherein generating the second refresh command to the memory device or screening out the memory device according to the comparison result comprises:
generating the second refresh command to the memory device if the comparison result is that the first refresh address information is a same as the expectation address information.

6. The method for detecting the memory device of claim 5, wherein generating the second refresh command to the memory device or screening out the memory device according to the comparison result further comprises:

screening out the memory device if the comparison result is that the first refresh address information is different from the expectation address information.

7. The method for detecting the memory device of claim 1, wherein the expectation address information is stored in a test equipment.

8. The method for detecting the memory device of claim 1, wherein reading out the first refresh address information according to the mode register read command comprises:
   generating the mode register read command to the memory device so as to output the first refresh address information via an I/O output pad.

9. A test system, comprising:
   a test equipment, configured to generate a first refresh command and a mode register read command; and
   a memory device, coupled to the test equipment, wherein the memory device comprises:
      a register, configured to store a first refresh address information according to the first refresh command; and
      a refresh circuit, coupled the register, and configured to read out the first refresh address information according to the mode register read command;
   wherein the test equipment is configured to compare the first refresh address information with an expectation address information to generate a comparison result, wherein the test equipment is configured to generate a second refresh command to the memory device or screening out the memory device according to the comparison result.

10. The test system of claim 9, wherein the memory device comprises a dynamic random access memory (DRAM).

11. The test system of claim 9, wherein the first refresh command is different from the second refresh command.

12. The test system of claim 9, wherein the refresh circuit is configured to refresh memory cells of one of rows of the memory device to generate the first refresh address information according to the first refresh command.

13. The test system of claim 9, wherein the test equipment is further configured to generate the second refresh command to the memory device if the comparison result is that the first refresh address information is a same as the expectation address information.

14. The test system of claim 13, wherein the test equipment is further configured to screen out the memory device if the comparison result is that the first refresh address information is different from the expectation address information.

15. The test system of claim 9, wherein the refresh circuit comprises a refresh counter, wherein the refresh counter is configured to count a number of test loops that generate the first refresh command and the second refresh command.

* * * * *

UNITED STATES PATENT AND TRADEMARK OFFICE
CERTIFICATE OF CORRECTION

| | | |
|---|---|---|
| PATENT NO. | : 11,621,052 B1 | Page 1 of 1 |
| APPLICATION NO. | : 17/643841 | |
| DATED | : April 4, 2023 | |
| INVENTOR(S) | : Jyun-Da Chen | |

It is certified that error appears in the above-identified patent and that said Letters Patent is hereby corrected as shown below:

In the Claims

Column 4, Line 44, in Claim 2, replace "detecting" with "testing";
Column 4, Line 47, in Claim 3, replace "detecting" with "testing";
Column 4, Line 50, in Claim 4, replace "detecting" with "testing";
Column 4, Line 56, in Claim 5, replace "detecting" with "testing";
Column 4, Line 64, in Claim 6, replace "detecting" with "testing";
Column 5, Line 4, in Claim 7, replace "detecting" with "testing"; and
Column 5, Line 7, in Claim 8, replace "detecting" with "testing".

Signed and Sealed this
Twelfth Day of August, 2025

Coke Morgan Stewart
*Acting Director of the United States Patent and Trademark Office*